United States Patent [19]

Christov

[11] 4,374,327
[45] Feb. 15, 1983

[54] DEVICE FOR INDICATING SPECIMEN STAGE POSITIONS IN AN ELECTRON MICROSCOPE

[76] Inventor: George Christov, 5204 Bangor Dr., Kensington, Md. 20795

[21] Appl. No.: 228,872

[22] Filed: Jan. 27, 1981

[51] Int. Cl.³ .............................................. G21K 5/10
[52] U.S. Cl. .............................. 250/442.1; 250/440.1
[58] Field of Search ............................... 250/440, 442

[56] References Cited

U.S. PATENT DOCUMENTS 3,678,270 7/1972 Braun et al. .
3,719,776 3/1973 Fujijasa et al. ..................... 250/442

*Primary Examiner*—Bruce C. Anderson
*Attorney, Agent, or Firm*—Edmund M. Jaskiewicz

[57] ABSTRACT

The device of the invention has two journaled wheels each having a rubber strip around its periphery and the wheel peripheries are in contact with the specimen traversing control rods of an electron microscope and the like. As the operator moves the control rods to shift the specimen stage along mutually perpendicular directions along X and Y axes, the rotary movements of the rods are transmitted to the wheels which in turn are connected to potentiometers. The potentiometer of each wheel is connected to an electrical source and the output signals correspond to the position of the specimen stage. The output signals are then connected to a X-Y recorder, to digital volt meters or modified video equipment (TV). As the specimen is scanned, points of interest on the specimen will be designated by XY coordinates and the coordinates enable the operator to readily relocate these specimen positions for photographic or other purposes.

5 Claims, 6 Drawing Figures

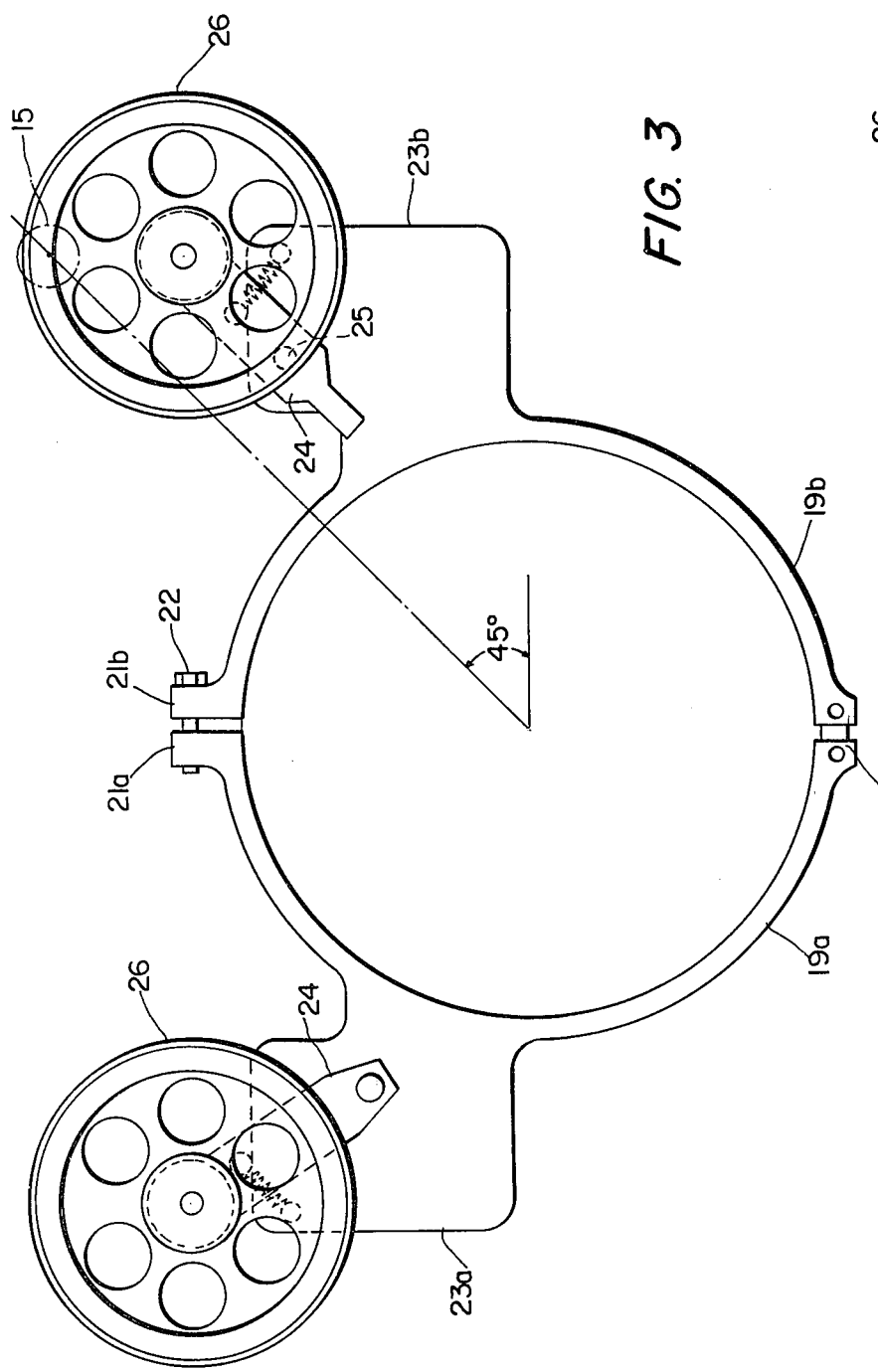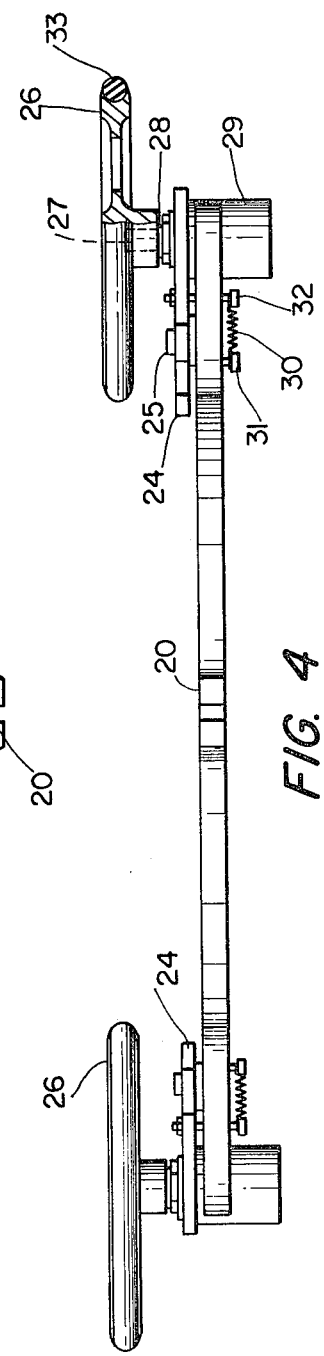

DEVICE FOR INDICATING SPECIMEN STAGE POSITIONS IN AN ELECTRON MICROSCOPE

The present invention relates to corpuscular ray devices such as electron microscopes, ion microscopes or electron defraction devices, more particularly, to a device for indicating positions of the specimen stage in the electron microscope and the like.

In using an electron microscope, the operator generally follows a pattern of scanning the entire or at least particular portions of a specimen. The specimen is mounted on a specimen stage within the microscope and the stage is movable in mutually perpendicular directions in a plane at right angles to the beam of electrons when the operator manually manipulates adjusting or control rods which are connected to the specimen stage. While the operator can very precisely control the movement of the specimen stage during scanning, it is very difficult and often impossible to relocate a previously observed spot or area of the specimen. Thus, if, during the scanning, the operator should see a point of particular interest he must take a photograph at that time of the point, or risk not being able to relocate that point. After a number of such photographs have been made, developed and enlarged all of the photographs must then be evaluated for the use for which they were intended. It is thus necessary to make a relatively large quantity of photographs even though only a small fraction of the large quantity of these photographs may subsequently be used. The necessity for taking photographs of every point of possible interest observed during scanning greatly increases the cost and time involved in carrying out a viewing operation with the electron microscope.

It is therefore the principal object of the present invention to provide a novel and improved device for locating predetermined specimen positions in an electron microscope, a scanning microscope, an electron probe or the like.

It is another object of the present invention to provide a device for indicating positions of a specimen stage in an electron microscope and the like to enable predetermined specimen positions to be relocated.

It is a further object of the present invention to provide a simple and effective device and process to locate previously observed spots or areas of the specimen in an electron microscope and which will decrease the costs and time involved in such operations.

According to one aspect of the present invention a device for indicating positions of a specimen stage in an electron microscope and the like having control rods engaging the specimen stage to shift the stage in mutually perpendicular directions may comprise means responsive to the rotary motion of the control rods for translating the mechanical motion of the specimen stage into electrical signals. Means are also provided which are responsive to the electrical signals to indicate visually reference values designating the position of the stage with respect to the directions of movement of the stage.

The electrical signals may be supplied to an X-Y recorder which plots the stage motion on graph paper. As an alternative, the electrical signals may be supplied to digital volt meters to which may be connected an electronic printer. The electrical signals may be then used in many different applications, depending on that particular purpose for which the specimen is being studied.

Other objects and advantages of the present invention will be apparent upon reference to the accompanying description when taken in conjunction with the following drawings, which are exemplary, wherein;

FIG. 3 is a top plan view of the device of the present invention with the wheels in relaxed or unstressed positions and with sections of the control rods indicated in phantom lines;

FIG. 4 is a side elevational view of the device of FIG. 3;

Proceeding next to the drawings wherein like reference symbols indicate the same parts throughout the various views a specific embodiment and modifications of the present invention will be described in detail.

Figure 1:
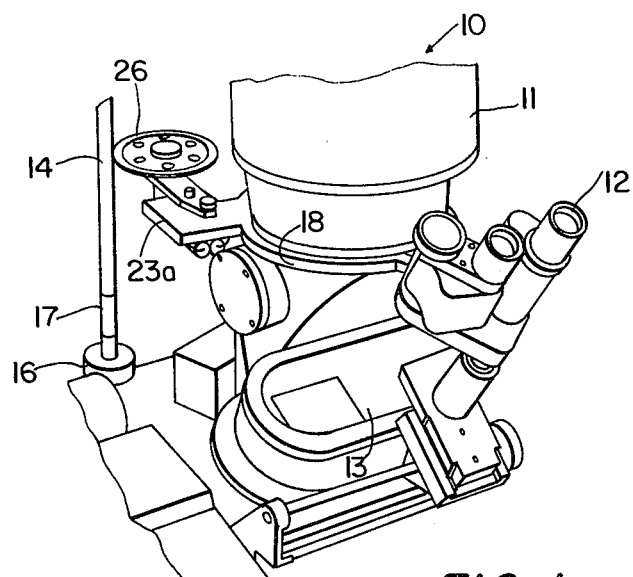
FIG. 1 is a perspective view of a portion of an electron microscope showing one control rod in contact with a wheel of the present invention.
Figure 2:
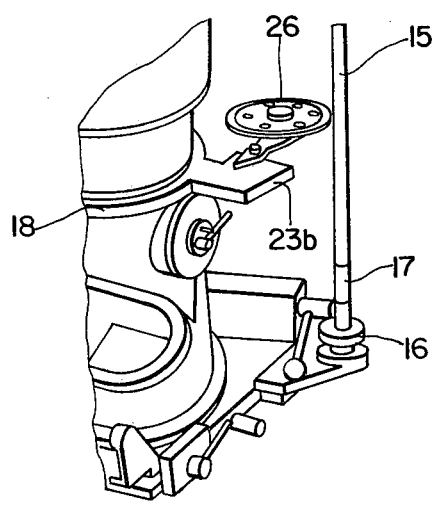
FIG. 2 is a perspective view of a portion of the electron microscope of FIG. 1 but showing the second control rod engaging a second wheel of the present invention.

As can be seen in FIGS. 1 and 2, there is indicated generally at 10 an electron microscope having a housing 11, an ocular or eye piece 12 and a viewing screen 13. The specimen stage which is mounted within the housing 11 in a known manner is movable in mutually perpendicular directions in a plane which in turn is perpendicular to the beam of electrons. The stage is connected in a known manner to vertical specimen traversing or control rods 14 and 15 located to the rear and laterally of the housing 11. The control rods 14 and 15 are journaled in substantially vertical positions as shown in the drawings and on the lower end of each control rod is a knurled wheel 16 which is manipulated manually by the operator. Above the knurled wheel is a knurled portion of the shaft 17 which also may be manipulated by the operator for coarse movement of the respective control or adjusting rod.

According to the present invention, a bracket 18 is clamped on the exterior surface of the housing 11 as indicated in FIGS. 1 and 2. The bracket 18, as may be seen in FIG. 3, consists of two halves 19a and 19b which are pivotally connected together at 20 by means of a pair of bolts or pins and a connecting link. The other ends of the halves 19a and 19b are provided with flanges 21a and 21b which have aligned axial bores threaded therethrough and a screw 22 interconnects the two halves. The bracket halves are each provided with arms 23a and 23b.

A supporting arm 24 is pivotally mounted on each bracket arm 23 by a pin or shaft 25 to journal the arm 24 for free pivoting movement. A wheel 26 of the size and shape as illustrated in FIGS. 3 and 4 is mounted on a shaft 27 journaled at 28 for free rotary movement and the lower end of the shaft 27 is connected to a rotary potentiometer 29 or an equivalent device. A spring 30 is connected between a pin 31 mounted on the underside of the support bracket 23 and to a pin or screw 32 mounted in the pivotable arm 24. The spring 30 is of the tension type which urges the pivotable arm 24 in a clockwise direction as viewed in FIG. 3. However, in a modification the spring may act in the counterclockwise direction.

The outer peripheral edge of the wheel 26 is provided with a rubber strip or tread 33 so as to permit non-skid movement between the wheel 26 and a control rod in a manner to be presently described.

On the other supporting bracket 23a a similar wheel and pivotable arm structure is also mounted.

The potentiometer 29 is preferably of the type which has ten turns for its entire range and may be 100,000 ohm size.

Figure 5:
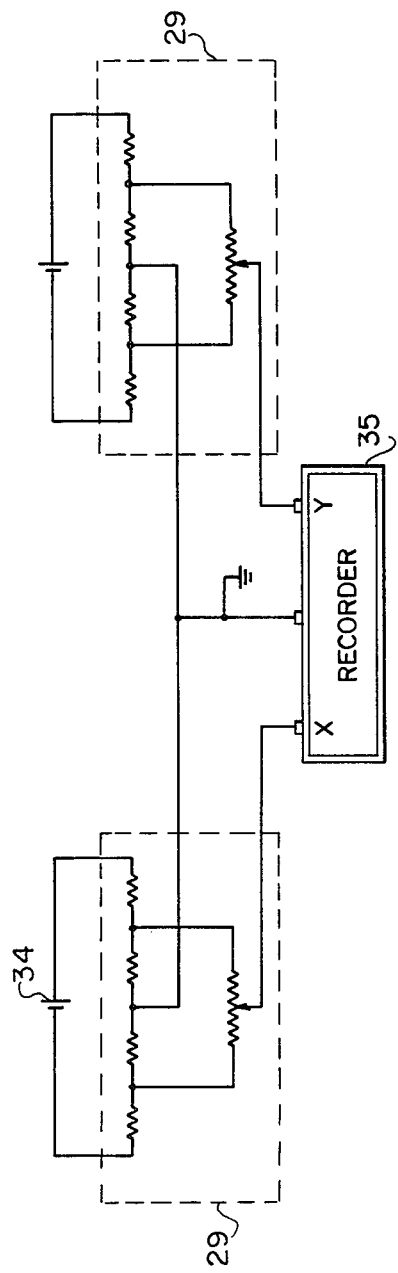
FIG. 5 is an electrical diagram showing schematically the electrical connections between the device of the present invention and an X-Y recorder.

As may be seen in FIG. 5, both potentiometers are connected electrically to an electrical source which may comprise a battery or batteries mounted underneath one of the supporting brackets 23. The potentiometers are then connected electrically to an X-Y recorder 35 which, in this embodiment, is a Heathkit X-Y Recorder Model 1R-5207 having a sensitivity of about 100 mv./cm. Recorders of other sensitivities may also be used. The recorder will then plot or trace upon graph paper the movements along the X and Y axes corresponding to the rotation of the control rods. The recorder then traces upon graph paper the path of movement of the specimen stage in response to the rotary motions of the control rods as manipulated by the electron microscope operator. When using the recorder the operator can merely indicate with a mark each point of interest on the path which he encounters as he scans the specimen. Each mark will then be at particular X-Y coordinates and these coordinates will enable the operator to readily relocate any desired point.

Figure 6:
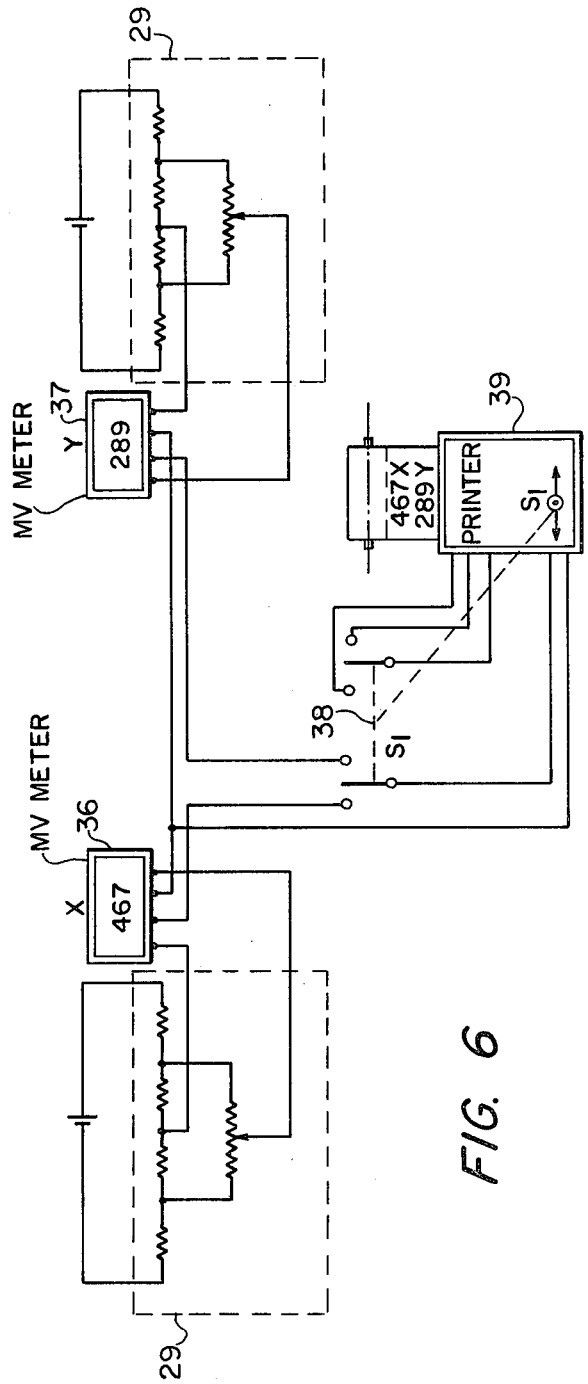
FIG. 6 is an electrical diagram showing schematically the connections between the device of the present invention to digital volt meters and an electronic printer.

In the modification of FIG. 6, the two potentiometers 29 are respectively connected to digital millivolt meters 36 and 37 which respectively visually indicate the X and Y coordinates of the particular point on the specimen which is being viewed.

The digital volt meters 36 and 37 are then connected through a suitable switch 38 to an electronic printer 39 which will print the values of the coordinates and thus provide a written record of particular points of interest on the specimen so as to facilitate relocating of these points at a later time.

The use of a recorder in FIG. 5 and the use of a printer in FIG. 6 are both desireable since these units provide written records of the path of the scan of the specimen. In FIG. 6, the printer may be eliminated if the operator merely writes by hand or punches on a calculator the values corresponding to the coordinates seen on the digital volt meters 36 and 37 of any point on the specimen which the operator considers to be of particular interest.

The values of the coordinates can also be displayed on a television video screen. However, the use of a video screen has the disadvantage that there will not be any written record of the path of scan of the specimen. This disadvantage could be overcome in part by providing a video screen of the type which retains an image thereon for a length of time or a microprocessor with memory.

During operation, while scanning a specimen with the electron microscope, the operator proceeds in his usual manner of following a predetermined, random or otherwise determined pattern of scanning of the specimen. Any desired path, regardless of its irregular pattern, may be followed by the operator. Each movement of the specimen stage in an X or Y direction as determined by rotation of the suitable control rod by the operator will result in a corresponding movement of one of the wheels 26. This movement of the wheel will in turn produce an electrical signal through the potentiometer and connected electrical source. This electrical signal can then be used to generate visual values as shown and described in FIGS. 5 and 6.

The viewing of the specimen may be conducted at any desired magnitude or magnification and the path of scanning of the specimen will be accurately indicated and recorded. However, in relocating a point of interest as determined by a set of coordinates it is preferred that the magnification be reduced so that a somewhat larger area of the specimen is covered which will facilitate relocating the previously determined point of interest.

It will be understood that this invention is susceptible to modification in order to adapt it to different usages and conditions and, accordingly, it is desired to comprehend such modifications within this invention as may fall within the scope of the appended claims.

What is claimed is:

1. A device for indicating positions of a specimen stage in an electronic microscope having manually operated vertical control rods engaging the specimen stage to shift the stage in mutually perpendicular directions, a bracket detachably mountable upon the housing of an electron microscope, a pair of arms pivotally mounted on said bracket, a pair of rotatable circular members each rotatably mounted on a said arm and having peripheral surfaces engaging respectively said control rods and rotating in conjunction with the motion of said control rods, spring means urging respectively each of said arms in a direction to maintain a said circular member in contact with a said control rod, potentiometer means connected to said circular members for generating electrical signals in response to rotary movement of said circular members, and means responsive to said electrical signals for indicating visually reference values designating the position of the stage with respect to said directions.

2. A device as claimed in claim 1 wherein said indicating means comprises a recorder to plot stage motion on graph paper.

3. A device as claimed in claim 1 wherein said indicating means comprises a television video screen.

4. A device as claimed in claim 1 wherein said indicating means comprises a pair of digital volt meters each responsive to the rotary motion of a control rod.

5. A device as claimed in claim 4 and further comprising an electronic printer connected to said digital volt meters to automatically record predetermined reference values indicated on said digital volt meters.

* * * * *